(12) United States Patent
Mostovoy et al.

(10) Patent No.: US 6,379,428 B1
(45) Date of Patent: Apr. 30, 2002

(54) METHOD FOR REDUCING PARTICLE CONCENTRATION WITHIN A SEMICONDUCTOR DEVICE FABRICATION TOOL

(75) Inventors: Roman Mostovoy, San Francisco; Glen T. Mori, Pacifica, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/501,697

(22) Filed: Feb. 10, 2000

(51) Int. Cl.[7] .................................................. B03C 3/82
(52) U.S. Cl. .............................. 95/63; 55/356; 55/360; 55/385.2; 55/385.6; 55/DIG. 18; 95/78; 454/187
(58) Field of Search ............................ 55/385.1, 385.2, 55/385.6, 356, 422, 360, DIG. 18; 95/63, 78; 454/187

(56) References Cited

U.S. PATENT DOCUMENTS

| | | | | |
|---|---|---|---|---|
| 2,684,126 A | * | 7/1954 | Doyle, Sr. .................... 55/360 |
| 4,202,676 A | * | 5/1980 | Pelosi, Jr. et al. ..... 55/DIG. 18 |
| 4,667,580 A | | 5/1987 | Wetzel ........................ 454/187 |
| 5,010,777 A | * | 4/1991 | Yehl et al. ............. 55/385.2 X |
| 5,296,018 A | * | 3/1994 | Suzuki ................... 55/385.2 X |
| 5,326,316 A | * | 7/1994 | Hashimoto et al. ......... 454/187 |
| 5,451,131 A | | 9/1995 | Hecht et al. ............... 118/50 X |
| 5,833,726 A | * | 11/1998 | Kinkead et al. ........ 55/385.1 X |
| 5,843,196 A | * | 12/1998 | Leavey et al. ................. 55/356 |
| 5,858,041 A | * | 1/1999 | Luetkemeyer ......... 55/DIG. 18 |
| 5,915,438 A | | 6/1999 | Winters et al. ............... 15/301 |
| 5,944,602 A | * | 8/1999 | Grundy ....................... 454/187 |
| 6,050,891 A | * | 4/2000 | Nering ........................ 454/187 |

* cited by examiner

Primary Examiner—Richard L. Chiesa
(74) Attorney, Agent, or Firm—Dugan & Dugan

(57) ABSTRACT

A method is provided for reducing the number of particles within a chamber of a fabrication tool located within a gray area of a clean room. A portable clean room station is provided that is capable of producing a white environment having fewer particles than the gray environment. The portable clean room station is positioned so that the chamber is exposed to the white environment of the portable clean room station rather than to the gray environment when the chamber is opened within the gray area. The white environment, which has fewer particles than the gray environment, is produced by employing the portable clean room station, and the chamber is then opened. Thereafter maintenance is performed on the opened chamber. Preferably the white environment is selected so as to have at least two orders of magnitude fewer particles per cubic foot than the gray environment.

20 Claims, 2 Drawing Sheets

METHOD FOR REDUCING PARTICLE CONCENTRATION WITHIN A SEMICONDUCTOR DEVICE FABRICATION TOOL

FIELD OF THE INVENTION

The present invention relates to semiconductor manufacturing equipment, and more particularly to a method for reducing particle concentration within a semiconductor device fabrication tool.

BACKGROUND OF THE INVENTION

In the semiconductor device fabrication industry a single defect can destroy an entire wafer die by shorting a junction region or open-circuiting a gate electrode of an essential semiconductor device. Defects also degrade device performance and reliability by creating leakage paths, generating undesirable localized fields, and the like.

A defect can arise when a particle lands on a wafer. Particles commonly arise from humans, the environment in which the wafer is processed (e.g., particles generated by friction between moving objects within the processing chamber), as well as from films deposited or grown on the wafer.

To reduce particle-induced defects, wafers are fabricated in a vacuum environment within a sealed semiconductor device fabrication tool (hereinafter "fabrication tool"). A fabrication tool typically includes at least one load lock that receives a wafer carrier containing one or more wafers, and that places the wafer carrier in a vacuum environment; at least one vacuum processing chamber for performing processing on wafers extracted from the wafer carrier, and at least one transfer chamber containing a wafer handler adapted to transfer wafers between the load lock and the processing chamber. Conventionally these fabrication tools are housed within an enclosed area known as a clean room, having filters and/or other mechanisms for removing particles from the environment.

A clean room is monitored to ensure that the level of particles per cubic foot of clean room does not exceed a predetermined level or clean room "class". However, due to the amount of filtering required and the cost of acquiring, maintaining and operating the filtering equipment, it is extremely expensive to achieve the highly clean environment required of an area in which a wafer or wafer carrier is exposed to the environment outside the fabrication tool. Typically a class 1 environment containing fewer than about 1 particle of 0.5 micron size or larger per cubic foot of air is required of such areas. Accordingly, because a fabrication tool maintains wafers and wafer carriers in a vacuum environment after they are loaded into the load lock and pumped down to vacuum pressure, the clean room surrounding the fabrication tool typically is divided into two areas, a white area having a high cleanliness level and a gray area having a lower cleanliness level than the white area. Wafers and/or wafer carriers are typically only exposed to a fabrication tool's external environment when the wafers and/or wafer carriers are adjacent the load lock. Accordingly only the area adjacent the load lock is maintained at the high cleanliness level (e.g., a class 1 cleanliness level) referred to as a white area (or white environment). The remainder of the fabrication tool is kept within the less clean or lower clean room class area referred to as a gray area (or gray environment), typically having a class 100 environment having fewer than about 10 particles of 0.5 micron size or larger per cubic foot of air.

To keep the interior of the fabrication tool itself clean, a vacuum atmosphere is maintained within the fabrication tool as continuously as possible, and extensive measures are taken to reduce moving parts and other sources of particle generation within the fabrication tool. Despite these measures, and despite maintenance of a clean room environment external to the fabrication tool, the occurrence of defect generating particles within fabrication tools remains perplexingly problematic. Accordingly, there is a need for a method which further reduces particle concentration within a semiconductor device fabrication tool.

SUMMARY OF THE INVENTION

The present inventors have discovered that a significant number of potentially defect generating particles which exist within a fabrication tool are neither generated within the tool, nor enter through the load locks. Rather, it has been discovered that these particles enter the fabrication tool when a given chamber is opened for maintenance (i.e., repair or routine maintenance). During maintenance a chamber is opened and the chamber's interior is conventionally exposed to the gray area environment which surrounds the fabrication tool. Although typically no wafer is exposed to the gray area environment, particles enter the chamber from the gray area and subsequently are not able to be completely removed from the interior of the chamber by the chamber's vacuum pump.

To overcome the shortcomings of the prior art, the present inventors provide a method for reducing the number of particles within a chamber of a fabrication tool that is located within a gray area of a clean room and, absent the inventive method, would be exposed to a gray area environment when opened. The invention provides a portable clean room station that is configured so as to provide a white environment (or any environment cleaner than the environment in which the fabrication tool is located). The portable clean room station surrounds at least the open portion of a fabrication tool's open chamber.

Preferably the environment provided by the portable clean room station is selected so as to have at least two orders of magnitude fewer particles per cubic foot of air than the gray area environment in which the portable clean room station is located.

By providing a portable clean room station within the gray area which surrounds a fabrication tool, a chamber of a fabrication tool may be exposed to significantly fewer potential defect generating particles when opened (e.g., during preventative maintenance, repair or other chamber maintenance), despite being physically located within the gray area. Device quality and chamber cleanliness thereby are significantly enhanced, and the cost of surrounding the entire fabrication tool with a white area environment is avoided.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1A:
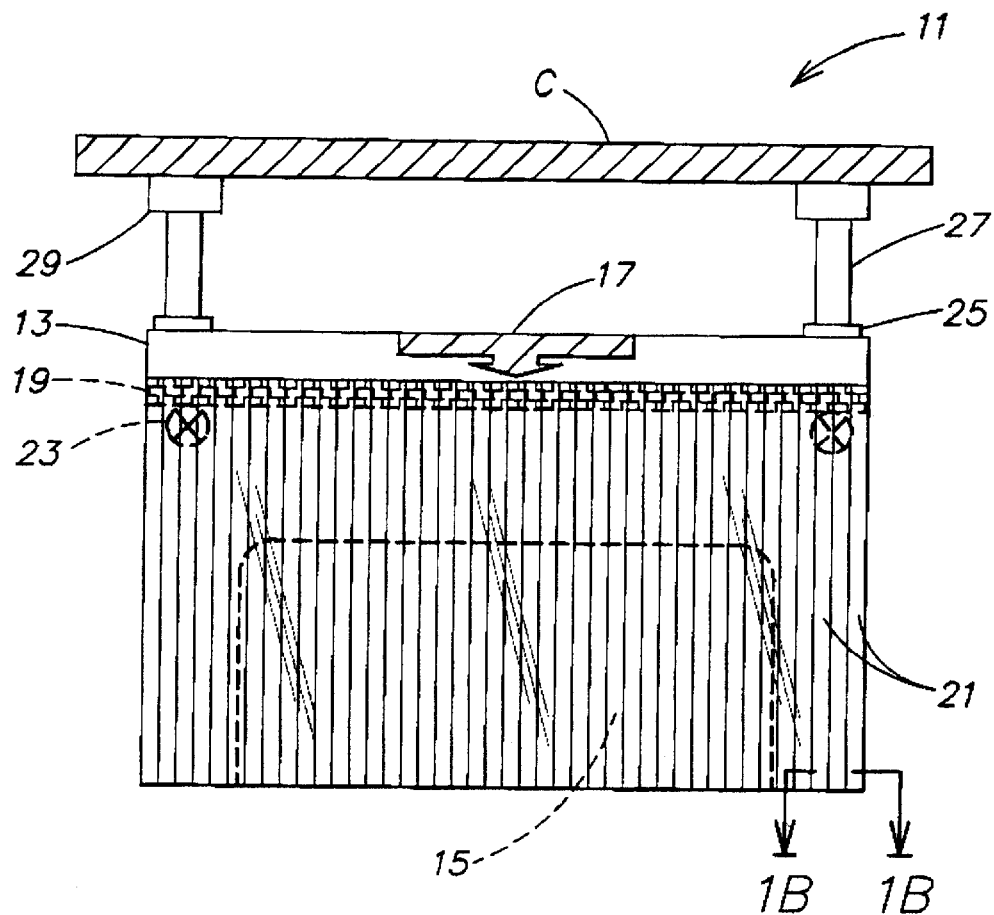
FIG. 1A is a schematic side view of a preferred embodiment of a portable clean room station for practicing the inventive method.
Figure 1B:
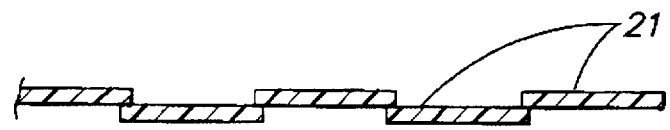
FIG. 1B is a sectional view through the strips which form the enclosure portion of the portable clean room station, taken along line 1B of FIG. 1A.

FIG. 1A is a schematic side view of a preferred embodiment of a portable clean room station 11 for practicing the inventive method. The portable clean room station 11 comprises a casing 13, the size and shape of which depends on the size and shape of a chamber 15 over which the portable clean room station is to be positioned. Typically the casing 13 is rectangular or square and is slightly larger than the chamber 15, so as to completely surround the chamber 15 whether the chamber 15 is opened or closed, and so as to allow sufficient space for a human or robotic operator to be partially or completely beneath the casing 13. The top surface of the casing 13 preferably is flat, and has a powered fan 17 mounted therein so as to draw air from above and force the air downwardly into the casing 13. The lower surface of the rectangular casing 13 has a laminar down-flow high efficiency particular air (HEPA), ultra low particle air (ULPA) filter 19 mounted therein. Around the perimeter of the casing 13 a plurality of strips 21 which are not inclined to develop static charge, and which are preferably transparent (e.g., poly-vinyl) are mounted and hang downwardly therefrom. A sectional view of the strips 21 taken along line 1B of FIG. 1A, is shown in FIG. 1B. The strips 21 extend a length sufficient to substantially prevent the chamber 15, when open, from exposure to the environment external to the portable clean room station 11. Adjacent ones of the strips 21 preferably overlap or are closely abutting, and preferably extend to the floor of the clean room in which the portable clean room station 11 is employed. An opening may be formed by lifting up the portion of the strips 21 which hang downwardly from the casing 13 or by separating adjacent strips (e.g., pushing them apart). The strips 21 which are to be positioned above a transfer chamber (FIG. 2) may be shorter in length than the remaining strips 21, so that such strips extend to the top of the transfer chamber but do not lie on top of the transfer chamber (in this manner gaps may be less likely to form between the strips 21 positioned above the transfer chamber).

Inside the curtain formed by the strips 21 optional static neutralization bars 23 (e.g., such as those manufactured by SIMCO of Hatfield, Pa.) may be mounted to the bottom of the filter 19 to eliminate static charges that can cause dust and/or other contaminants to accumulate on surfaces and restricted spaces of the open chamber 15 due to the opposite polarity charge that may otherwise exist between the charged particles and the respective surface. Optionally, the portable clean room station 11 may be mounted to overhead rails so as to facilitate movement around a clean room. As shown in FIG. 1A, mounted to the upper portion of the casing 13 are clamps 25 which are coupled to mounting bars 27 which in turn are slidably mounted to rails 29 that are clamped to a ceiling C of a clean room. Thus, after work (e.g., maintenance) on the chamber 15 is complete, the portable clean room station 11 may be automatically (via a motor not shown) or manually moved along the rails 29 to another chamber 15 within the clean room.

Figure 2:
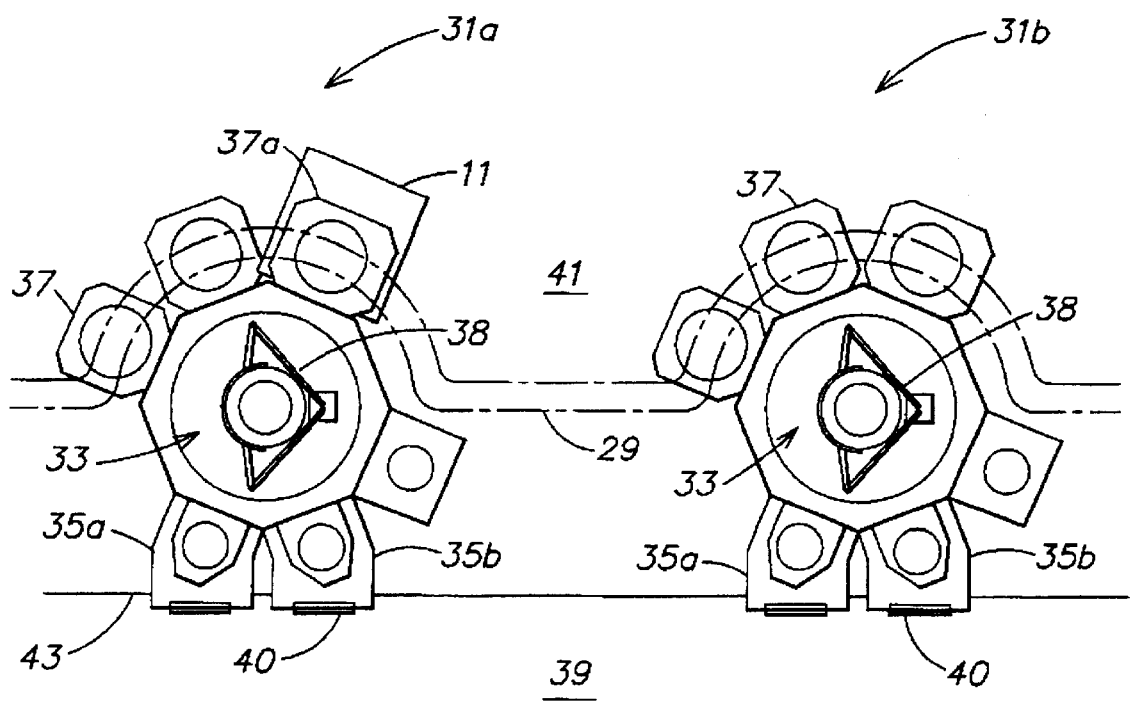
FIG. 2 is a schematic top plan view portion of an exemplary clean room which employs the portable clean room station of FIG. 1A.

FIG. 2 is a schematic top plan view of a portion of an exemplary clean room which employs the portable clean room station 11 of FIG. 1A. The clean room comprises one or more vacuum fabrication tools 31a–b such as the Endura™ or Centura™ both of which are manufactured by Applied Materials, Inc. of Santa Clara Calif. The exemplary fabrication tools 31a–b each comprise a central transfer chamber 33 coupled between one or more load lock chambers 35a–b adapted to pump and vent between vacuum and atmospheric pressure, and one or more vacuum processing chambers 37 adapted to perform a vacuum process on a substrate (e.g., a patterned or non-patterned semiconductor wafer, a glass substrate, or the like). The central transfer chamber 33 contains a wafer handler 38 for transferring substrates among the load lock chambers 35a–b and the processing chambers 37.

The clean room is divided into a white area 39 adjacent the load ports 40 of the load locks 35a–b and a gray area 41 adjacent the remainder of the tool 31a–b. The white area 39 and the gray area 41 are separated by a wall 43. Within the gray area 41, the rails 29 extend above the tool 31 in a configuration that allows the portable clean room station 11 to travel along the rails 29 to positions above the various processing chambers 37 and/or the central transfer chamber 33, of the various fabrication tools 31a–b. Appropriate switching mechanisms for transferring the portable clean room station between various portions of the rails 29 will be readily apparent to those of ordinary skill in the art.

In operation when one of the processing chambers 37 or the central transfer chamber 33 requires maintenance, the portable clean room station 11 travels (automatically or manually) along the rails 29 to a position above the chamber which requires maintenance (e.g., chamber 37a). As the portable clean room station 11 moves into position above the chamber 37a, a number of the plurality of strips 21 travel along the top of the chamber 37a. When the portable clean room station 11 is in position above the chamber 37a the strips 21 preferably hang straightly along each side of the chamber 37a. The fan 17 is then engaged and air is pulled in by the fan 17 and pushed through the filter 19 into the area adjacent the chamber 37a. The strips 21 contain the flow of filtered air provided by the filter 19. As the air passes from the gray area 41 through the filter 19 particles are removed such that the environment within the curtain of strips 21 becomes a white environment, or at least an area having greater cleanliness and lower particle concentration than adjacent areas. Preferably the filter 19 renders the air that passes therethrough twice as clean as the air in the gray area. As the filtered air passes the static neutralization bars 23 static charge also is removed therefrom. The filtered air passes the chamber 37a and is drawn in by fans conventionally located on the floor of the gray area 41.

After the flow of filtered air is established within the curtain of strips 21, the chamber 37a is opened and the desired maintenance is performed while the portable clean room station continues to surround the open chamber 37a with a white area environment. Thereafter the chamber 37a is closed and the fan 17 is turned off. Normal processing (e.g., semiconductor fabrication processing such as physical or chemical vapor deposition etch, etc.) may then resume within processing chamber 37a, and the portable clean room station may travel along the rails 29 to the next chamber in need of maintenance.

Conventionally, maintenance of a processing chamber located within a gray environment has been performed in a manner that exposes the interior of the processing chamber to the gray environment. However, because the inventive method does not expose the interior of the processing chamber to the gray area environment, fewer particles enter the open processing chamber, and consequently fewer particles remain in the chamber to potentially contaminate a wafer processed therein.

The foregoing description discloses only the preferred embodiments of the invention, modifications of the above disclosed apparatus and method which fall within the scope of the invention will be readily apparent to those of ordinary skill in the art. For instance, the invention may be employed within clean rooms having any configuration, including those that do not employ a white area or a wall for dividing white and gray areas. Further, the invention may be employed with any fabrication tool or processing chamber. The support brackets and rails along which the portable clean room station may travel, may be mounted to the clean room floor, or to other clean room surfaces. Further, the portable clean room station specifically described is merely exemplary and portable clean room stations having other configurations may be employed. Other mechanisms may be employed to facilitate movement of the portable clean room station (e.g., wheels or rollers located on the bottom of a frame having one or more poles extending upwardly therefrom to support the casing of the portable clean room station) or a simple modular arrangement that is manually placed on the chamber as will be readily apparent to a worker of ordinary skill in the art.

Finally, it will be understood that a processing chamber may be configured to be top opening, side opening etc., as will be apparent to those of ordinary skill in the art. The invention may be used with any chamber, regardless of the specific manner in which the chamber opens. The curtained enclosure which surrounds the open processing chamber preferably comprises a plurality of strips. However, larger pieces of material may be employed rather than a plurality of thin strips.

Accordingly, while the present invention has been disclosed in connection with the preferred embodiments thereof, it should be understood that other embodiments may fall within the spirit and scope of the invention, as defined by the following claims.

The invention claimed is:

1. A method of reducing the number of particles within a chamber of a fabrication tool, the chamber located within a gray area environment of a clean room, the method comprising:

providing a portable clean room station capable of producing an environment having fewer particles than the gray area environment;

positioning the portable clean room station so that the chamber is exposed to the environment produced by the portable clean room station, rather than to the gray area environment, when the chamber is opened within the gray area;

producing the environment having fewer particles than the gray area environment by employing the portable clean room station; and opening the chamber within the portable clean room station.

2. The method of claim 1 wherein positioning the portable clean room station comprises forming a curtain around at least a portion of the chamber and around at least a portion of the portable clean room station.

3. The method of claim 1 wherein the environment produced by the portable clean room station has at least two orders of magnitude fewer particles per cubic foot than the gray environment.

4. The method of claim 1 wherein the gray environment comprises an environment no cleaner than about a clean room class 100 environment.

5. The method of claim 1 wherein the environment produced by the portable clean room station comprises an environment at least as clean as a clean room class 1 environment.

6. The method of claim 1 wherein providing a portable clean room station further comprises providing a charge neutralization mechanism and wherein producing the environment having fewer particles than the gray area environment further comprises neutralizing charged particles within the environment produced by the portable clean room station.

7. The method of claim 1 further comprising performing chamber maintenance on the opened chamber while the chamber is exposed to the environment produced by the portable clean room station.

8. The method of claim 7 further comprising closing the chamber following chamber maintenance while the chamber is exposed to the environment produced by the portable clean room station.

9. The method of claim 1, wherein the positioning step includes moving the portable clean room station along rails.

10. A method of reducing a number of particles which may enter a processing chamber of a fabrication tool, the fabrication tool having at least one load lock adapted to receive a wafer from a white area of a clean room, a wafer handler chamber coupled to the load lock, the wafer handler chamber having a wafer handler therein, and at least one processing chamber coupled to the wafer handler and to the wafer handler chamber, the wafer handler chamber and the at least one processing chamber being located within a gray area of the clean room, the method comprising:

providing a portable clean room station capable of producing a white environment having fewer particles than a gray environment of the gray area;

positioning the portable clean room station so that the at least one chamber of the fabrication tool is exposed to the white environment of the portable clean room station rather than to the gray environment when the at least one chamber is opened within the gray area;

producing the white environment having fewer particles than the gray environment by employing the portable clean room station; and opening the at least one chamber within the portable clean room station.

11. The method of claim 10 wherein positioning the portable clean room station comprises placing a curtain around at least a portion of the at least one chamber and around at least a portion of the portable clean room station.

12. The method of claim 10 wherein the white environment has at least two orders of magnitude fewer particles per cubic foot of air than the gray environment.

13. The method of claim 10 wherein the gray environment comprises an environment no cleaner than about a clean room class 100 environment.

14. The method of claim 10 wherein the white environment comprises an environment at least as clean as about a clean room class 1 environment.

15. The method of claim 10 wherein providing a portable clean room station further comprises providing a charge neutralization mechanism and wherein producing the white environment having fewer particles than the gray environment further comprises neutralizing charged particles within the white environment.

16. The method of claim 10 further comprising performing chamber maintenance on the at least one opened chamber while the chamber is exposed to the white environment.

17. The method of claim 16 further comprising closing the at least one chamber following chamber maintenance while the chamber is exposed to the white environment.

18. The method of claim 17 further comprising moving the portable clean room station to position the portable clean room station so that an additional processing chamber located within the gray area is exposed to the white environment of the portable clean room station rather than to the gray environment when the additional processing chamber is opened within the gray area.

19. The method of claim 10 further comprising moving the portable clean room station to position the portable clean room station so that an additional processing chamber located within the gray area is exposed to the white environment of the portable clean room station rather than to the gray environment when the additional processing chamber is opened within the gray area.

20. The method of claim 10, wherein the positioning step includes moving the portable clean room station along rails.

* * * * *